United States Patent [19]

Delacourt et al.

[11] Patent Number: 5,077,466
[45] Date of Patent: Dec. 31, 1991

[54] DETECTOR OF ELECTROMAGNETIC WAVES HAVING FIVE DIFFERENT FORBIDDEN GAP WIDTHS

[75] Inventors: Dominique Delacourt, Paris; Michel Papuchon, Massy; Jean-Paul Pocholle, Arpajon, all of France

[73] Assignee: Thomson-CSF, Puteaux, France

[21] Appl. No.: 544,895

[22] Filed: Jun. 28, 1990

[30] Foreign Application Priority Data

Jul. 4, 1989 [FR] France ............................. 89 08961

[51] Int. Cl.$^5$ ............................................. H01J 40/14
[52] U.S. Cl. .................................... 250/211 J; 357/4
[58] Field of Search ..................... 250/211 J; 357/30 E, 357/4 SL, 16

[56] References Cited

U.S. PATENT DOCUMENTS

| | | | |
|---|---|---|---|
| 4,671,830 | 6/1987 | Burnham | 148/186 |
| 4,806,993 | 2/1989 | Voisin et al. | 357/16 |
| 4,903,101 | 2/1990 | Maserjian | 357/30 E |

FOREIGN PATENT DOCUMENTS 0299841 1/1989 European Pat. Off. .
WO8801792 3/1988 PCT Int'l Appl. ............... 357/4 SL

OTHER PUBLICATIONS

Applied Physics Letters, vol. 53, No. 20, Nov. 14, 1988, pp. 1961-1963, New York, U.S., S. R. Kurtz, et al., "High Photoconductive Gain in Lateral InAsSb Strained-Layer Superlattice Infrared Detectors".
Applied Physics Letters, vol. 50, No. 16, Apr. 20, 1987, pp. 1092-1094, New York, U.S., B. F. Levine, et al., "New 10 $\mu$m Infrared Detector Using Intersubband Absorption in Resonant Tunneling GaAlAs Superlattices".

Primary Examiner—David C. Nelms
Assistant Examiner—Que T. Le
Attorney, Agent, or Firm—Oblon, Spivak, McClelland, Maier & Neustadt

[57] ABSTRACT

A quantum well electromagnetic wave detector disclosed having a semiconductor structure including a stacking of layers of material wherein the widths of the forbidden gaps of the materials are used to obtain a profile of potential energy corresponding to the bottom of the conduction band for the electrons in such a way that a first layer has a relatively low energy level with second and third layers having an intermediate energy higher than the energy of the first layer and fourth and fifth layers having high energy greater than either the intermediate or the low energy levels. The energy corresponding to a first permitted level is lower than the potential energy at the bottom of a conduction band of both of the materials used to make the second and third layers and the energy of the second level is between the potential energy at the bottom of a conduction band of both materials of the second and third layers and the potential energy of the bottom of the conduction band of the materials of the fourth and fifth layers. The first permitted level of energy of the quantum well is populated with electrons and an electric field is applied perpendicular to the plane of the structure.

15 Claims, 7 Drawing Sheets

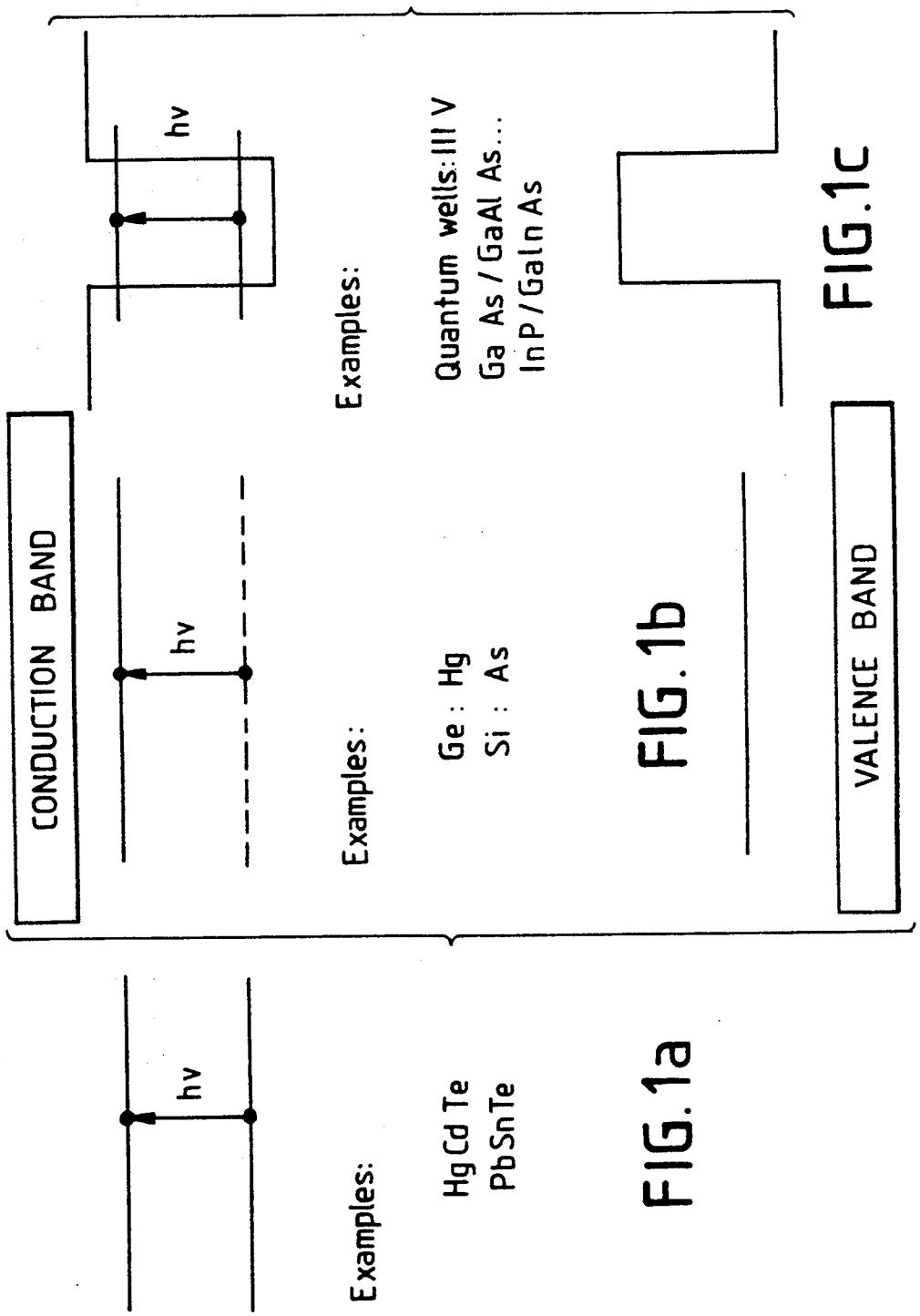

FIG_9
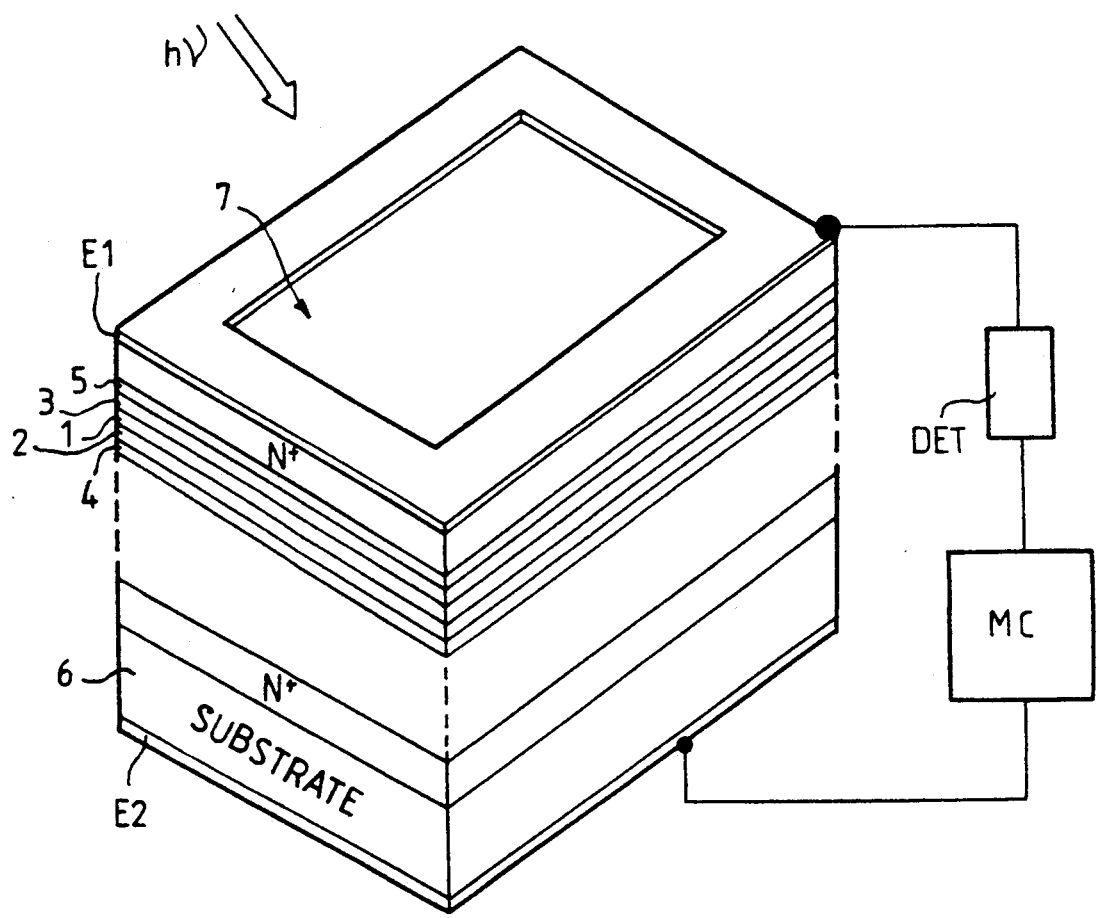
FIG_10
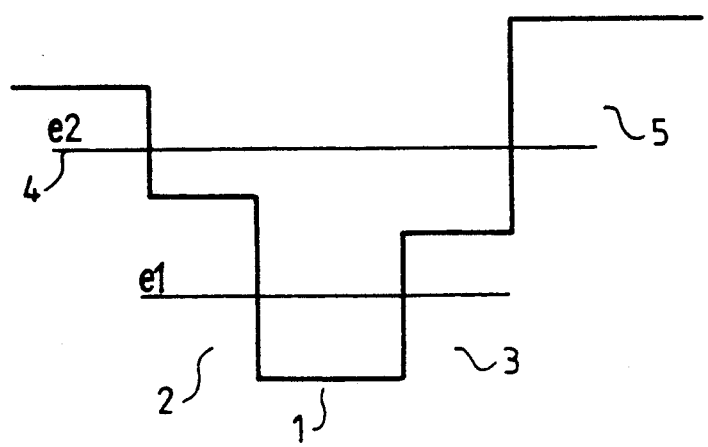

DETECTOR OF ELECTROMAGNETIC WAVES HAVING FIVE DIFFERENT FORBIDDEN GAP WIDTHS

BACKGROUND OF THE INVENTION

1. Field of the Invention

The invention concerns a detector of electromagnetic waves and, more precisely, a detector of electromagnetic waves based on quantum well semiconductors.

2. Description of the Prior Art

At present, several approaches may be used to detect an electromagnetic wave belonging to the mean infrared range, i.e. one with a wavelength that is situated typically between 2 and 20 μm. Among these approaches, we might cite the use of:

(a) semiconductor materials of the II-IV and IV-VI groups;
(b) doped semiconductor materials of the IV group;
(c) associated III-V semiconductor materials in multiple quantum well structures.

The first approach (a) consists in using semiconductor materials, the forbidden gap width of which is smaller than the photon energy $h\nu$ of the wave to be detected which therefore makes it possible to transfer electrons from the valence band to the conduction band. These electrons are then collected by means of an external circuit and are the cause of a photocurrent that enables the detection (see FIG. 1a). Among the materials with a forbidden gap width compatible with this type of operation in the mean infrared range, we might cite the II-VI group alloys of the HgCdTe type and the IV-VI group alloys of the PbSnTe type.

The second approach (b) providing for the use of semiconductors with a larger forbidden gap width than the photon energy to be detected is possible by resorting to a doping of the materials used. This doping reveals an electron donor level corresponding to the impurities that cause the doping. From this energy level, which is closer to the bottom of the conduction band than is the top of the valence band, it will be possible for electron transitions to occur towards the conduction band, freeing the electrons that have undergone these transitions under the effect, in particular, of an infrared electromagnetic field (see FIG. 1b) and making them detectable. For example, the doping of silicon with arsenic (Si:As) or of germanium with mercury (Ge:Hg) enables detection in a special spectral range located, in terms of wavelength, around 10 microns.

The third approach (c) is based on the occurrence of the electron transitions between permitted levels of energy ($e_1$ and $e_2$) within the conduction band of semiconductor quantum structures. FIG. 1c gives an example of this type of transition in a well having two discrete levels of energy permitted for the electrons. By the application of an electrical field to this type of configuration, it is possible, as indicated in FIGS. 2a and 2b, to make an extraction from the well, in a preferred way, of the electrons located at the excited quantum level ($e_2$ in FIG. 2a and $e'_2$ in FIG. 2b). Thus, the collection, in the external electrical circuit, of these electrons coming from the second quantum level to which they have been taken by an infrared illumination ($h\nu$), enables the detection of this illumination. The approach which is an object of the invention concerns infrared detectors of this third type (c).

The type of detector to which the invention can be applied is therefore based on the occurrence, under the effect of an infrared illumination, of electron transitions within the conduction band of semiconductor quantum wells. The principle of operation of these detectors is therefore based on the use of these transitions to place the electrons initially located at the fundamental level of the wells at a level enabling them to easily leave the well under the effect of an applied electrical field. Up till now, two configurations corresponding to the approaches of the above-described FIGS. 2a and 2b have been proposed to make this type of operation possible. The approach shown in FIG. 2a uses a quantum well displaying two levels $e_1$ and $e_2$ of permitted energy for the electrons in the conduction band. Under the effect of an illumination represented by its photon energy $h\nu$ in FIG. 2a, electron transitions may occur from the level $e_1$ towards the level $e_2$. By the application of an electrical field E to the structure, it is then possible to make the electrons located at the level $e_2$ cross the potential barrier $\phi$ in order to extract them from the well. The electrons then participate in a photocurrent enabling the detection of the illumination.

Devices of this type have been described in the following articles:

B. F. Levine, K. K. Choi, C. G. Bethea, J. Walker and R. J. Malik, "New 10 μm detector using intersubband absorption in resonant tunneling GaAlAs superlattices", APL 50 (26), 20 April 1987, p. 1092.

K. K. Choi, B. F. Levine, C. G. Bethea, J. Walker and R. J. Malik, "Multiple quantum well 10 μm GaAs/Al$_{(x)}$Ga$_{(1-x)}$)As infrared detector with improved responsivity", APL 50 (25), 22 June 1987, p. 1814.

B. F. Levine, K. K. Choi, C. G. Bethea, J. Walker and R. J. Malik, "Quantum well avalanche multiplication initiated by 10 μm intersubband absorption and photoexcited tunnelling", APL 51 (12), 21 September 1987, p. 934.

The configuration of FIG. 2b is based on the use of a well having only one bound level e1, separated from the top of the barrier forming the well by an energy close to the photon energy $h\nu$ of the electromagnetic wave to be detected (see FIG. 2b). The transitions occur between this level and a virtual level located in the continuum.

Devices of this type have been described in the following articles:

B. F. Levine, C. G. Bethea, G. Hasnain, J. Walker, R. J. Malik, "GaAs/AlGaAs quantum-well long-wavelength infrared (LWIR) detector with a detectivity comparable to HgCdTe", Elec. Letters, Vol. 24, No. 12, 9/6/88, p. 747.

B. F. Levine, C. G. Bethea, G. Hasnain, J. Walker, R. J. Malik, "High detectivity D*=1.0×10$^{10}$ cm$\sqrt{Hz}$/W GaAs/AlGaAs multiquantum well 8.3 μm detector", APL 53(4), 25 July 1988, p 296.

To obtain a major absorption of the illumination to be detected, a large number of wells is used within the detectors based on this quantum principle, and this is done irrespectively of the approach chosen, whether that of FIG. 2a or of FIG. 2b. Thus, the conduction band of these multiple quantum well (MQW) structures can be symbolized by the FIGS. 3a and 3b. These FIGS. 3a and 3b respectively correspond to two types of transitions that have just been evoked with respect to the FIGS. 2a and 2b. This type of structure is based on the periodic stacking of layers of a first material $M_1$ and a second material $M_2$. The widths of the forbidden gaps of the two materials are different in order to obtain potential wells for the electrons in the conduction band The contact layers located on both sides of the periodic region designated by the MQW may be formed, for example, by layers of n doped material $M_1$ referenced $M_1n+$. To increase the number of possible transitions, generally n type doping of the MQW zone is resorted to.

Among the characteristics shown by these two approaches, the following elements may be noted, in referring again to FIGS. 2a and 2b:

in the case of the approach of FIG. 2a, the transitions occur between two levels located beneath the potential barrier between the wells. Consequently, the electrons located at the two levels have high confinement in the width $2d_1$ of the wells, whence a high transition efficiency between the two levels. The working of this type of detector takes advantage of the difference in mobility in the direction perpendicular to the plane of the layers forming the wells, between the electrons located on the levele $e_1$ and those located on the level $e_2$. For example, to be extracted from the well, the electrons located at the level $e_2$ have a lower potential barrier $\phi$ to cross than do the electrons located at the level $e_1$ retained in a field in the well by a barrier $\phi + h\nu$). Furthermore, the width of this barrier is smaller ($l_2$) for the level $e_2$ than for the level $e_1$ ($l_1$). This is so because of the potential profile communicated to the structure by the electrical field used for the collection of the photoelectrons. Nevertheless, this potential barrier to be crossed restricts the performance characteristics of the detector because it limits the difference in mobility in the transport perpendicular to the semiconductor layers between the electrons located at the level $e_1$ and those located at the level $e_2$, the two levels being separated by the energy $h\nu$ given by the central wavelength of the detector response curve.

If we now look at FIG. 2b, it can be seen, on this assumption, that the electrons excited by the electromagnetic field to be detected no longer have any barrier to cross in order to be extracted from the well, and this favors their participation in the photocurrent. On the contrary, the level $3'_2$ to which the photo-excited electrons are taken from the level $e_1$ is virtual, and the probability of transition is far smaller than in the case of FIG. 2a, given the very low level of localization, in the zone of the well, of the electrons located at this virtual level $e'_2$. In other words, the wave function associated with this level is not confined to the zone of the well.

However, as a comparison between the two known configurations (FIGS. 2a and 2b), it may also be pointed out that in the first example (FIG. 2a), the distance $l_2$ depends directly on the field applied to the structure. The more it is sought to reduce $l_2$, the more does it become necessary to apply a strong field and the more is $l_1$ reduced. This has the consequence of increasing the dark current of the structure. The problem is different in the case of FIG. 2b where weaker fields may be enough for the efficient collection of the photo-excited carriers but where, as we have seen, there is the problem of the low probability of transition between the fundamental level of the well and the excited virtual level. The known approaches, therefore, do not provide for the association of a high-level response, due to a high probability of transition between a fundamental level and an excited level $e'_2$, on the one hand, and a very low dark current on the other. This becomes possible through the invention proposed herein, as can be seen in the following paragraph.

To provide an answer to the problem of obtaining a high response and a low dark current on one and the same detector based on the occurrence of interband transitions within the conduction band of multiple quantum well structures, the barrier to be crossed should be very different for the electrons located on the excited level and for those located on the fundamental level. The solution proposed consists in giving the well a particular potential profile.

SUMMARY OF THE INVENTION

This is why the invention concerns an electromagnetic wave detector for the detection of waves ($h\nu$) to be detected, comprising:

a semiconductor structure having at least one stacking of first, second, third, fourth and fifth layers, the widths of the forbidden gaps of which can be used to obtain the following profile of potential energy corresponding to the bottom of the conduction band for the electrons relatively low energy for the first layer giving a reference (0) of the energies;

intermediate energy for the second and third layers;

energy of higher value for the fourth and fifth layers;

the energy corresponding to a first permitted level ($e_1$) being lower than the potential energy (V1) of the bottom of the conduction band of both of the materials used to make the second and third layers, the energy corresponding to a second level ($e_2$) being between the potential energy V1 of the bottom of the conduction band of both the materials of the second and third layers and the potential energy (V1+V2) of the bottom of the conduction band of both the materials of the fourth an fifth layers;

means for populating the first permitted level ($e_1$) of energy of the quantum well with electrons;

means for applying an electrical field perpendicularly to the plane of the structure.

The invention also concerns an electromagnetic wave detector for the detection of waves ($h\nu$) to be detected comprising:

a semiconductor structure having at least one stacking of first, second, third, fourth and fifth layers, the forbidden gap widths of which make it possible to obtain the following profile of potential energy corresponding to the top of the valence band for the holes:

relatively low energy for the first layer giving a reference (0) of the energies;

intermediate energy for the second and third layers;

energy of higher value for the fourth and fifth layers;

the energy corresponding to a first permitted level ($e_1$) being lower than the potential energy (V1) of the top of the valence band of both of the materials used to make the second and third layers, the energy corresponding to a second level ($e_2$) being between the potential energy V1 of the top of the valence band of both the materials of the second and third layers and the potential energy (V1+V2) of the top of the valence band of both the materials of the fourth and fifth layers;

means for populating the first permitted level of energy of the quantum well with holes.

BRIEF DESCRIPTION OF THE DRAWINGS

The different objects and characteristics of the invention will appear more clearly from the following description, given as an example, with reference to the appended figures of which:

FIGS. 1a to 3b show diagrams of energy levels of exemplary prior art detectors described above;

FIG. 4b depicts an example of a semiconductor device, showing a conduction band diagram such as the one shown in FIG. 4a;

FIG. 9 shows another exemplary embodiment of the structure of the invention;

FIG. 10 shows the diagram of a conduction band of an alternative embodiment of the invention.

DESCRIPTION OF PREFERRED EMBODIMENTS

Figure 4A:
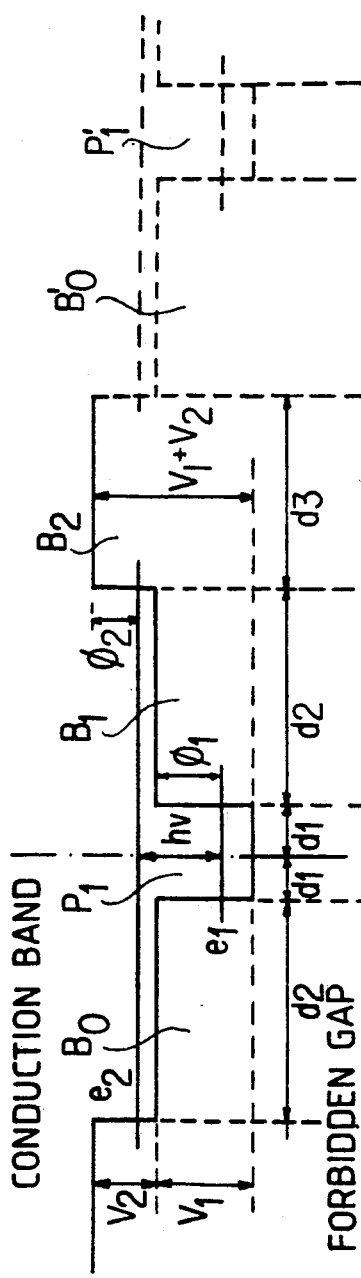
FIG. 4a shows a diagram of energy levels of an exemplary embodiment of a detector according to the invention.

The invention is an infrared detector based on the occurrence of electron transitions between two permitted quantum levels $e_1$ and $e_2$ for the electrons within the potential well, the profile of which is shown in FIG. 4a.

Figure 4B:
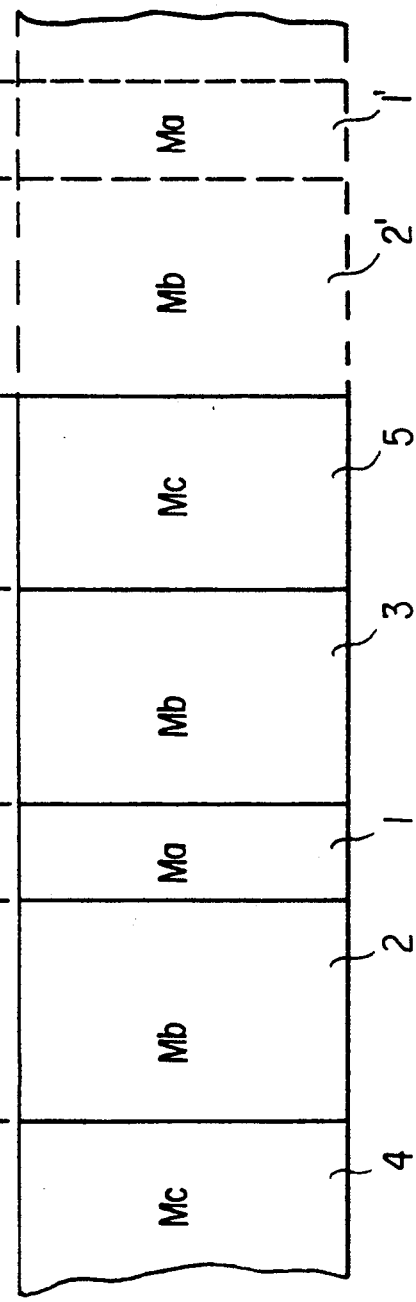

Such a profile of the conduction band is obtained by means of a structure shown in FIG. 4b, comprising a layer 1 of a first material Ma framed between two layers 2 and 3 of a second material Mb, the unit being itself framed by two layers 4 and 5 of a third material Mc.

The layer 1 has a forbidden gap width which is smaller than that of the layers 2 and 3, and the forbidden gap width of the layers 2 and 3 is itself smaller than that of the layers 4 and 5.

The layers 1 to 5 therefore constitute a quantum well such as the one shown in FIG. 4a constituting intermediate barriers or stepped barriers (B1, B2).

Several sets of layers 1 to 5, thus described, may be attached to one another, and the association of several wells of this type, to cumulate the effect sought on each of these wells, leads to a shape of conduction band, namely a potential energy profile, that is also shown in FIG. 4 in which the major parameters of the structure are indicated. The energy difference between the energy levels $e_1$ and $e_2$ depends chiefly on the parameters $d_1$, $d_2$, $V_1$, $V_2$.

This difference between the levels $e_1$ and $e_2$ may also be modified by the width $d_3$ of the highest barrier should this width be small enough to allow the coupling between the levels $e_2$ of two successive wells. For the designing of the structures, the values of these different parameters should therefore be determined so that the device effectively has high absorption and high detectivity for the desired photon energy $h\nu$.

The invention is also based on the fact that the level $e_1$ is at a potential energy below $V_1$ and that the level $e_2$ for its part is at a potential energy between $V_1$ and $V_1+V_2$. In practice, it will be sought to obtain a high value for $\phi_1$ in order to limit the dark current. It must also be noted that the making of this structure calls for at least three materials $M_a$, $M_b$, $M_c$ with different forbidden gap widths.

FIG. 4 thus shows that two consecutive wells are separated by two of the barriers of different levels. We therefore have stepped barriers.

However, detectors with stepped barriers using a greater number of materials are also envisaged within the framework of the invention. In effect, a greater number of materials may enable the number of steps per barrier to be increased or the wells to be made dissymmetrical, providing them with different barriers to the right and to the left.

Figure 5:
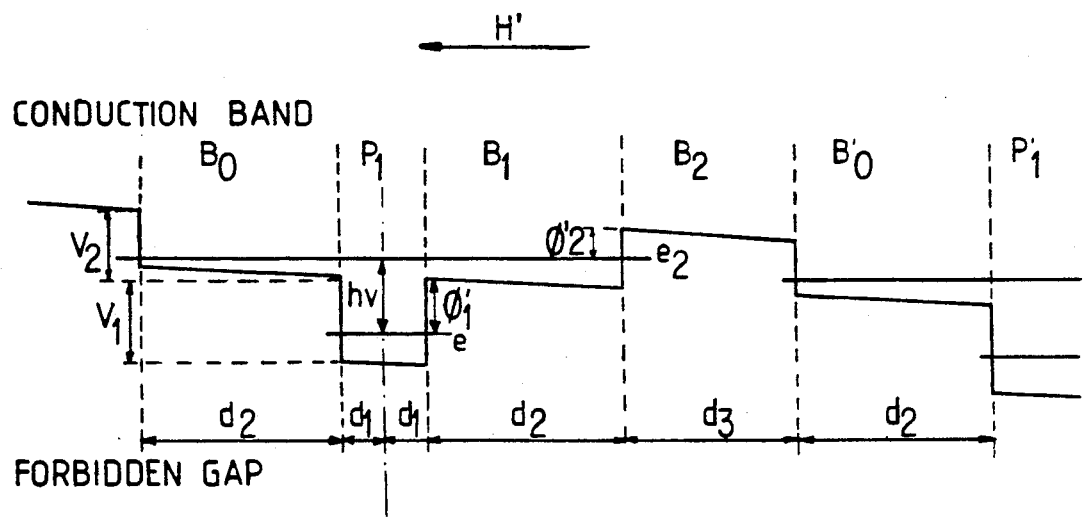
FIGS. 5 and 6 are diagrams of conduction bands of the device of FIG. 4b subjected to electrical fields.

Under a weak field H', the diagram of the conduction band becomes that of FIG. 5. The tunnel effect between the levels $e_1$ of two consecutive wells is very sharply restricted because of the barrier $B_1+B_2+B'0$, i.e. $d_2+d_3+d_2$ to be crossed. It is also to be noted that the barrier height $V_1+V_2$, which is greater in the central zone with a width $d_3$ than in the two contiguous zones with a width $d_2$, accentuates this limitation. By contrast, as far as the electrons located at the level $e_2$ are concerned, their perpendicular transport is facilitated by the low barrier height $\phi'_2$, the small thickness d of the barrier $B_2 (d_3 < d_3 < d_3 + 2d_2)$.

Figure 2A:
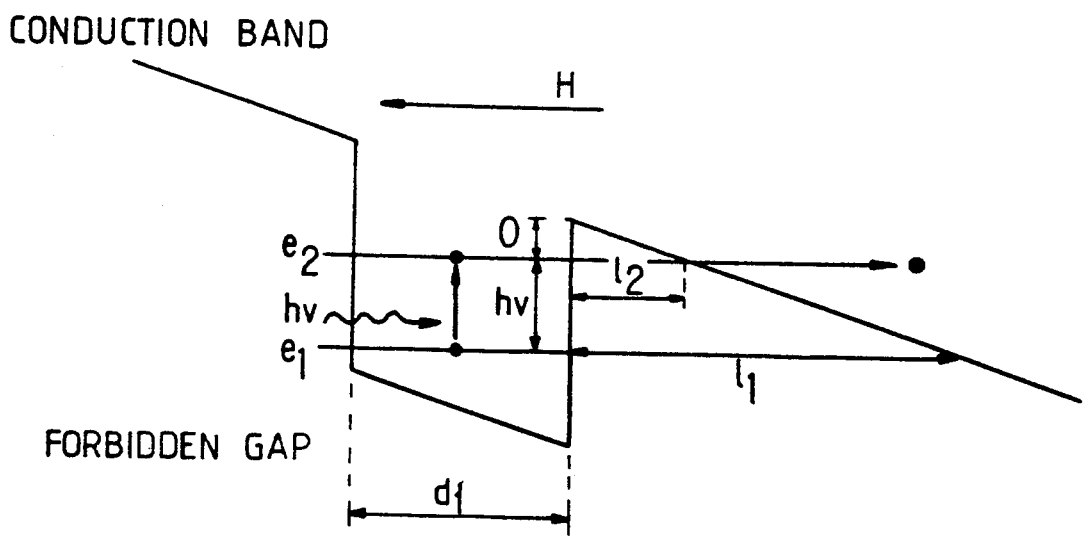
Figure 2B:
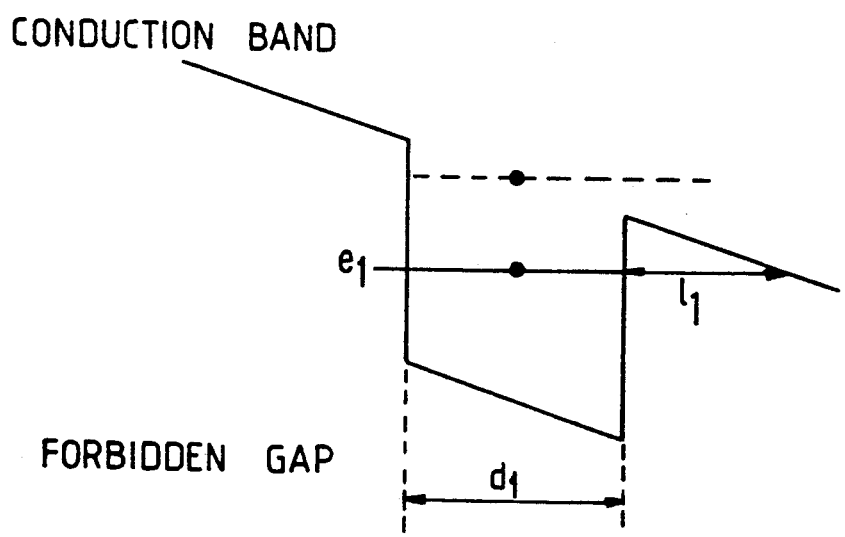
Figure 3A:
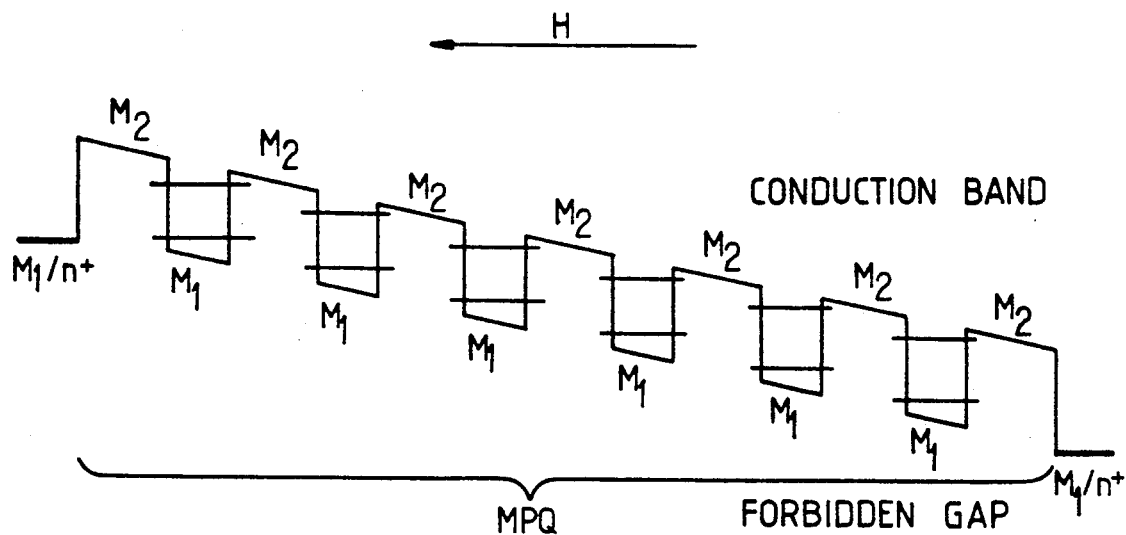
Figure 3B:
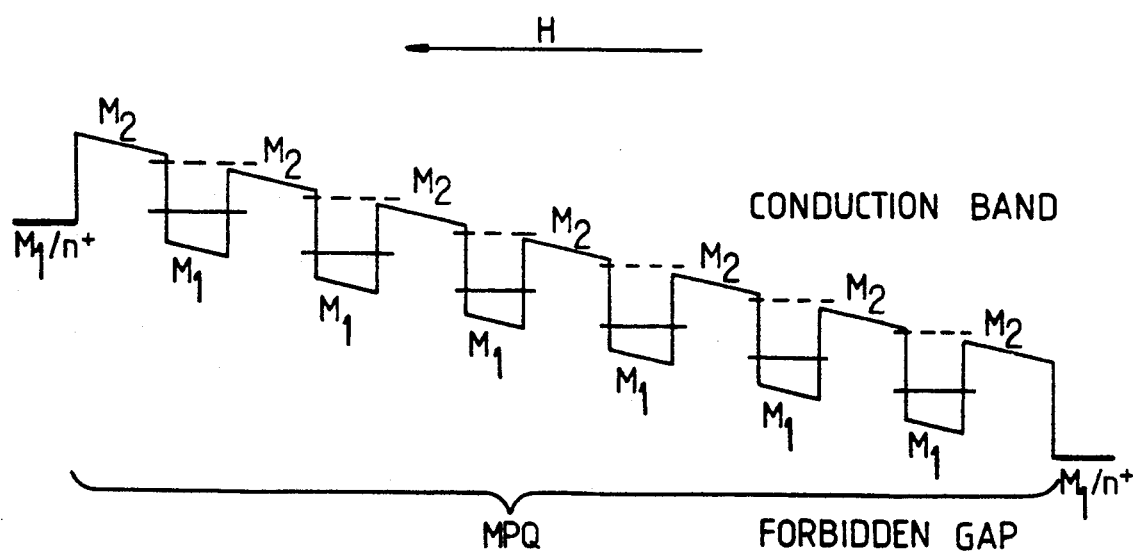
Figure 6:
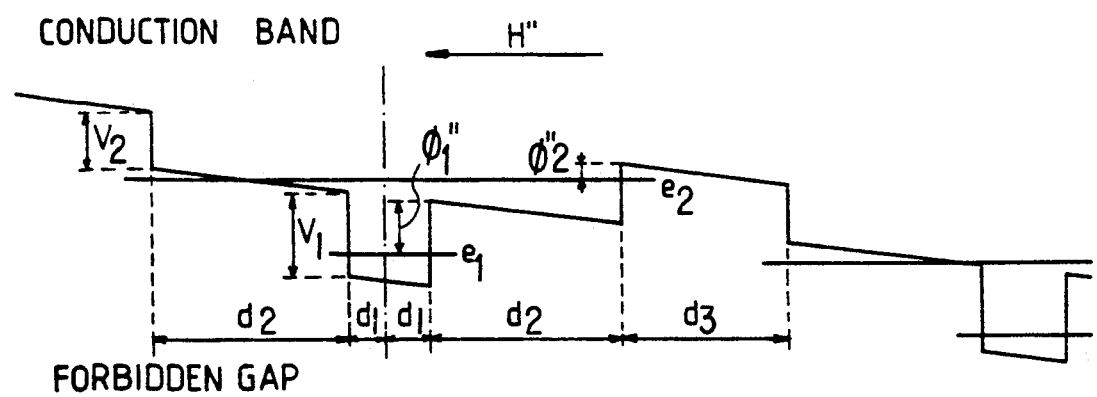

When the applied field increases to a value H" to give the band structure the shape indicated in FIG. 6, and can attain the conditions of operation of this type of detector, the barrier $\phi'_2$ diminishes with greater speed than the barrier $\phi'_1$. In effect, for a given field, the variation in potential with respect to the center of a well is greater at the distance $d_1+d_2$ from this center than at the distance $d_1$ which can be written: $H''(d_1+d_2)>H'd_1$. Consequently, this original configuration can be used to promote the passage, in the continuum, under the effect of an electrical field, of the electrons located at the level $e_2$, while at the same time keeping a high barrier for the electrons located at the level $e_1$ which have not been excited by the wave to be detected, and the transport of which, perpendicularly to the quantum wells, corresponds to a dark current. However, the level $e_2$ remains confined since its energy level is located above $V_2$. Consequently, since the electrons located at the levels $e_1$ and $e_2$ are confined in the region of the well, the probability of transition remains high, unlike what would happen if we used the known approach of FIG. 2b described above. This original configuration thus makes it possible to limit the dark current while, at the same time, increasing the response of the MQW (multiple quantum well) type detectors It must be noted that the width $d_3$ of the barrier may also play a major role in this type of device. For example, if $d_3$ is big enough, given the height of $\phi_2$, the well may be considered to be uncoupled since the extensions of the wave functions will not permit this coupling between consecutive levels $e_2$ and even less between levels $e_1$. If the dimension $d_3$ is small enough to enable the coupling between consecutive levels $e_2$, a tunnel effect between these levels could take place under a weak applied field. This could favor the response of the detector under these weak field conditions, and hence the low dark current.

Figure 7:
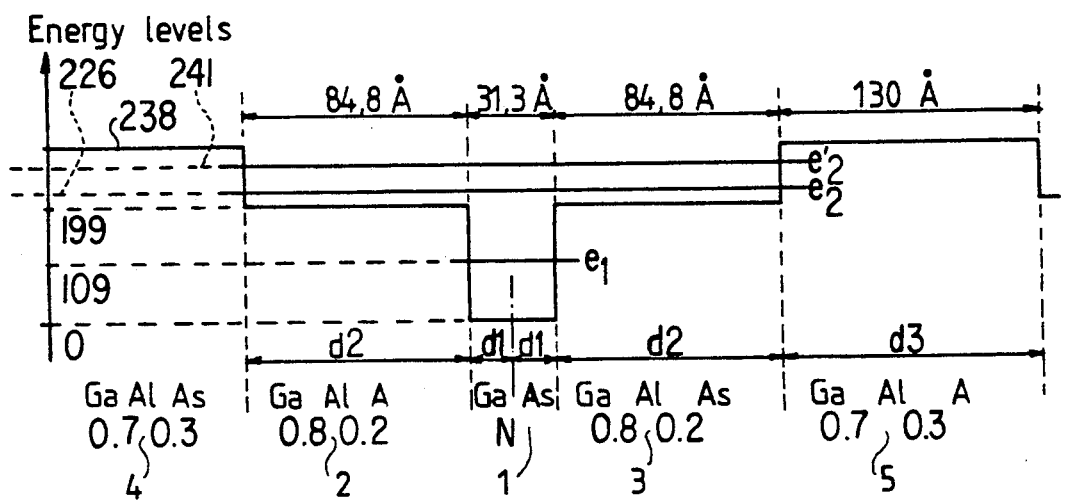
FIGS. 7 and 8 are diagrams of conduction bands of devices of the type shown in FIG. 4b, having several energy levels.

FIG. 7 shows the conduction band of an exemplary embodiment of a structure according to the invention. This structure, which is a detailed exemplary embodiment of the structure of FIG. 4b, comprises:

a layer 1 of gallium arsenide;

layers 2 and 3 of gallium arsenide and aluminium, with the general formula $Ga_{1-x}Al_xAs$; for example, in FIG. 7, x is equal to 0.2 and the formula is $Ga_{0.8}Al_{0.2}As$.

layers 4 and 5 of gallium arsenide and aluminium, with the general formula $Ga_{1-y}Al_yAs$; for example, in FIG. 7, y is equal to 0.3 and the formula is $Ga_{0.7}Al_{0.3}As$.

This structure is a quantum well having a first bound level $e_1$ below the potential energy ($V_1$) of the bottom of the conduction band of the materials of the layers 2 and 3, as well as two energy levels $e_2$ and $e_3$ such as the level $e_2$ is between the bottom of the conduction band of the materials of the layers 2 and 3 and the bottom of the conduction band of the materials of the layers 4 and 5. For this example, the transitions useful for the detection should be produced between the levels $e_1$ and $e_2$.

Figure 8:
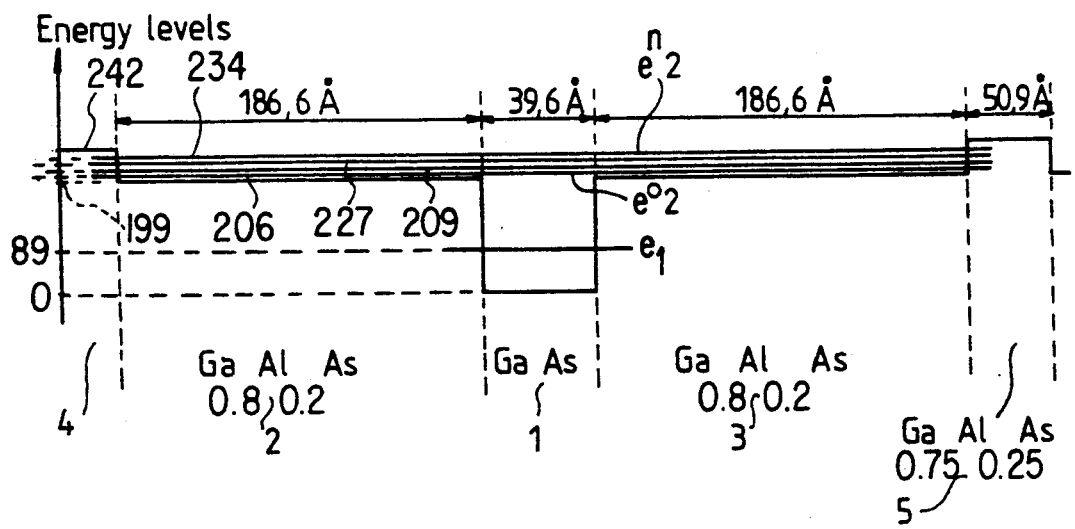

According to a second exemplary embodiment of the invention, the structure may be such that it has a conduction band such as the one shown in FIG. 8:

the layer 1 is made of GaAs and has a thickness of 39.6 angstroms;

the layers 2 and 3 are made of $Ga_{0.8}Al_{0.2}As$ and have thicknesses of 186.6 angstroms;

the layers 4 and 5 are made of $Ga_{0.75}Al_{0.25}As$ and have thicknesses of 50.9 angstroms.

This structure has a certain number of energy levels, five for example, namely the first level $e_1$ and the second level $e_2$, located as described above (at 89 meV and 206 meV) plus three levels $e_3$, $e_4$, $e_5$. For these examples, the transitions useful for detection should occur between the levels $e_1$ and $e_2$.

For determining the levels, other than the fundamental levels $e_1$, their possible coupling among wells has not been taken into account. This coupling results in an enlargement of these levels which may go up to the creation of mini-bands.

FIG. 9 shows a structure of a detector according to the invention. The above-described layers 1 to 5 are seen again, reproduced several times as indicated in dashes to form a a quantum multiple well.

The unit is supported by a substrate 6 which may be made of a semi-insulator material.

Two electrodes E1 and E2 enable the application of an electrical field to the structure under the control of a control generator MC. The electrode E1 has a window 7 enabling the transmission of a light flux $h\nu$ to be detected to the structure.

The energy levels $e_1$ of the quantum wells may be populated with electrons by doping as indicated above.

These energy levels $e_1$ may also be populated with electrons by illumination by a pumping light wave in the near infrared range given by means that are not shown.

In both cases, the detector works and detects the radiation $h\nu$ when an electrical field is applied by the generator MC.

This detection is done by means of a current detector DET, series connected in the electrical field application circuit.

The invention therefore concerns the detection of an electromagnetic wave through the use of electron transitions between discrete energy levels within the conduction band of quantum wells which may be associated in a large number to increase the response of detectors of this type At present, the existing approaches in this particular field do not satisfactorily allow for limiting the dark current and, at the same time, preserving a sufficient response.

The invention concerns a structure using a step shape for the two barriers that form the well. This step shape enables the detector to be made to function between two discrete barriers $e_1$ and $e_2$ while, at the same time, helping towards the extraction, from the well, of the electrons located at the level $e_2$. Having this barrier shape amounts to giving the well a smaller dimension for the electrons located on the level $e_1$ than for the electrons located on the level $e_2$ which nevertheless remain confined in the zone of the well, thus making it possible to maintain a high probability of transition $e_1$ towards $e_2$. Furthermore, this original configuration makes it possible, when several of these wells are associated in order to increase the response of the device, to limit the dark current due, in particular, to the transport, from well to well, of electrons located at the level $e_1$. By contrast, the potential barrier "seen" by the electrons located at the level $e_2$ is far smaller and facilitates the transport of these photo-excited electrons along the structure. Thus, the use of wells with stepped barriers enables the response/dark current ratio to be optimized.

In the foregoing, firstly, the materials of the layers 2 and 3 have been taken to be the same and, secondly, the materials of the layers 4 and 5 have been taken to be the same. However, this need not be so as can be seen in FIG. 10. For the device to work as described above, the levels $e_1$ and $e_2$ should be located as follows:

for $e_1$, at a level below the potential energy of the bottom of the conduction band of the materials of the two layers 2 and 3;

for $e_2$, at a level between the potential energies of the bottom of the conduction bands of the materials of the layers 2 and 3, on the one hand, and of the layers 4 and 5 on the other hand.

Besides, the exemplary embodiments have been described in the foregoing with reference to the conduction bands. However, the description would be the same when made with reference to the valence bands of the materials.

It is clear that the foregoing description has been given purely as an example.

Alternatives may be envisaged without going beyond the scope of the invention. The numerical examples have been given only to illustrate the invention.

What is claimed is:

1. An electromagnetic wave detector for the detection of waves ($h\nu$) to be detected, comprising:

a semiconductor structure having at least one stacking of first, second, third, fourth and fifth layers, the widths of the forbidden gaps of which can be used to obtain the following profile of potential energy corresponding to the bottom of the conduction band of the electrons relatively low energy for the first layer giving a reference (0) of the energies;

intermediate energy for the second and third layers;

energy of higher value for the fourth and fifth layers;

the energy corresponding to a first permitted level ($e_1$) being lower than a potential energy (V1) of the bottom of the conduction band of both of the materials used to make the second and third layers, the energy corresponding to a second level ($e_2$) being between the potential energy (V1) of the bottom of the conduction band of both of the materials of the second and third layers and the potential energy (V1+V2) of the bottom of the conduction band of both of the materials of the fourth and fifth layers;

means for populating the first permitted level ($e_1$) of energy of the quantum well with electrons;

means for applying an electrical field perpendicularly to the plane of the structure.

2. An electromagnetic wave detector for the detection of waves ($h\nu$) to be detected comprising:

a semiconductor structure having at least one stacking of first, second, third, fourth and fifth layers, the forbidden gap widths of which make it possible to obtain the following profile of potential energy corresponding to the top of the valence band for the holes:

relatively low energy for the first layer giving a reference (0) of the energies;

intermediate energy for the second and third layers;

energy of higher value for the fourth and fifth layers; the energy corresponding to a first permitted level ($e_1$) being lower than the potential energy (V1) of the top of the valence band of both of the materials used to make the second and third layers, the energy corresponding to a second level ($e_2$) being between the potential energy (V1) of the top of the valence band of both of the materials of the second and third layers and the potential energy (V1+V2) of the top of the valence band of both of the materials of the fourth and fifth layers;

means for populating the first permitted level of energy of the quantum well with holes.

3. A detector according to claim 1, wherein the semiconductor structure has several levels ($e_2$ and $e_1$) between the potential energy (V1) of the bottom of the conduction band of the materials of the second and third layers and the potential energy (V1+V2) of the bottom of the conduction band of the materials of the fourth and fifth layers.

4. A detector according to claim 1, wherein the means for populating the energy level with electrons correspond to a doping enabling a populating of the first energy level with electrons.

5. A detector according to claim 4, wherein the first layer has N type doping.

6. A detector according to claim 4, wherein at least any one of said layers has N type doping.

7. A detector according to any of the claims 1 or 2, wherein the means for populating the energy level with electrons comprise means emitting a pump light wave towards the structure, said pump light wave being capable of populating the first energy level with electrons.

8. A detector according to either of the claims 1 or 2, wherein the different layers are made with the following materials:

GaAs for the first layer;

$Ga_{(1-x)}Al_xAs$ for the second and third layers;

$Ga_{(1-y)}Al_yAs$ for the fourth and fifth layers;

9. A detector according to either of the claims 1 or 2, comprising several successions of layers forming several stacked quantum wells 10. A detector according to either of the claims 1 or 2, made on a semi-insulator substrate.

11. A detector according to either of the claims 1 or 2, wherein the means for controlling the absorption of the wave to be detected include two electrodes, located on either side of the structure, said electrodes being connected to the terminals of a voltage source and enabling an electrical field E to be applied to the structure.

12. A detector according to claim 11 including, in the electrical circuit for application of the electrical field, a current detector detecting a current due to the detection of an electromagnetic wave.

13. A detector according to claim 2, wherein the means for populating the energy level with holes correspond to a P type doping of at least any one of said layers.

14. A detector according to any one of the claims 1 or 2, wherein the means for populating the energy level with electrons or holes comprise a radiation source illuminating the quantum well so as to create electrons in the conduction band corresponding to holes in the valence band.

15. A detector according to claim 1, wherein the difference in energy between the first permitted level ($e_1$) and the second level is substantially equal to the photon energy of the wave to be detected ($h\nu$).

* * * * *